(12) United States Patent
Kang et al.

(10) Patent No.: US 8,263,463 B2
(45) Date of Patent: Sep. 11, 2012

(54) NONVOLATILE SPLIT GATE MEMORY CELL HAVING OXIDE GROWTH

(75) Inventors: Sung-Taeg Kang, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 293 days.

(21) Appl. No.: 12/413,987

(22) Filed: Mar. 30, 2009

(65) Prior Publication Data

US 2010/0244120 A1    Sep. 30, 2010

(51) Int. Cl.
*H01L 29/792* (2006.01)
*H01L 21/336* (2006.01)

(52) U.S. Cl. ............... 438/287; 257/325; 257/E29.309; 257/E21.423; 438/265; 438/591

(58) Field of Classification Search .......... 438/287, 438/265; 257/325
See application file for complete search history.

(56) References Cited

U.S. PATENT DOCUMENTS

| | | | |
|---|---|---|---|
| 5,668,028 A * | 9/1997 | Bryant ................. | 438/287 |
| 6,171,927 B1 | 1/2001 | Sung et al. | |
| 6,331,492 B2 | 12/2001 | Misium et al. | |
| 6,335,262 B1 | 1/2002 | Crowder et al. | |
| 6,943,098 B2 * | 9/2005 | Yeh et al. ............ | 438/525 |
| 7,012,005 B2 * | 3/2006 | Lichtenberger et al. ... | 438/270 |
| 7,208,377 B2 * | 4/2007 | Lenoble ............. | 438/265 |
| 2007/0148845 A1 * | 6/2007 | Jung ................. | 438/197 |
| 2007/0196988 A1 | 8/2007 | Shroff et al. | |
| 2007/0218633 A1 * | 9/2007 | Prinz et al. .......... | 438/267 |
| 2008/0188052 A1 | 8/2008 | Winstead et al. | |

OTHER PUBLICATIONS

Huang et al; "Nitrogen-doped poly spacer local oxidation" IEEE Electron Device Letters, vol. 18, Issue 7, Jul. 1997 pp. 346-348.
Yu, B., et al., "Gate Engineering for Deep-Submicron CMOS Transistors", IEEE Transactions on Electron Devices, vol. 45, No. 6, Jun. 1998, pp. 1253-1262.
Adam, L.S., et al., "Comprehensive Model for Nitrogen Diffusion in Silicon", IEEE Electron Devices Meeting, IEDM Technical Digest, 2001, pp. 847-850.
Adam, L.S., et al., "A Physical Model for Implanted Nitrogen Diffusion and Its Effect on Oxide Growth", IEEE Electron Devices Meeting, IEDM Technical Digest, 2000, pp. 507-510.

* cited by examiner

*Primary Examiner* — Matthew W Such
*Assistant Examiner* — Robert Carpenter
(74) *Attorney, Agent, or Firm* — James L. Clingan, Jr.

(57) ABSTRACT

A split gate nonvolatile memory cell on a semiconductor layer is made by forming a gate dielectric over the semiconductor layer. A first layer of gate material is deposited over the gate dielectric. The first layer of gate material is etched to remove a portion of the first layer of gate material over a first portion of the semiconductor layer and to leave a select gate portion having a sidewall adjacent to the first portion. A treatment is applied over the semiconductor layer to reduce a relative oxide growth rate of the sidewall to the first portion. Oxide is grown on the sidewall to form a first oxide on the sidewall and on the first portion to form a second oxide on the first portion after the applying the treatment. A charge storage layer is formed over the first oxide and along the second oxide. A control gate is formed over the second oxide and adjacent to the sidewall.

17 Claims, 6 Drawing Sheets

NONVOLATILE SPLIT GATE MEMORY CELL HAVING OXIDE GROWTH

BACKGROUND

1. Field

This disclosure relates generally to nonvolatile memory cells, and more specifically, to nonvolatile memory cells having oxide growth.

2. Related Art

Semiconductor non-volatile memories (NVMs), and particularly flash electrically erasable, programmable read-only memories (EEPROMs), are widely used in a range of electronic equipment from computers, to telecommunications hardware, to consumer appliances. The flash EEPROM is encountered in numerous configurations. In particular, a floating-gate NVM cell is characterized by a stacked gate construction in which a floating gate, typically formed from polysilicon, is separated from the substrate by a first (lower) oxide layer and is separated from a polysilicon control gate by a second (upper) oxide layer. No direct electrical connection is made to the floating gate (hence, "floating").

In another configuration, a charge storage layer comprising nanocrystals as the charge storage mechanism is used in place of the floating gate. The nanocrystals function as isolated charge storage elements.

As devices continue to become smaller with advances in semiconductor device technology, the performance of the individual memory cells has become more important. The read function and threshold voltage variation in particular suffer with reduced device performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In some non-volatile memory (NVM) devices, a split gate structure uses a select gate and a control gate which are separated by a gap region. If this gap region is unnecessarily thick or wide, then the read current may be reduced and thus degraded, and the threshold voltage variation among a plurality of NVM cells may be undesirably increased. In some methods, the oxide on the sidewall of the select gate is grown at the same time as the oxide grown on the substrate under the control gate. The thickness of the oxide grown on the substrate under the control gate is primarily determined by the requirements for data retention of the overlying charge storage layer, and thus cannot be easily reduced. Oxidation of the doped polysilicon sidewall occurs at a faster rate than the oxidation of the monocrystalline substrate. This results in the oxide grown on the sidewall of the select gate being thicker, as much as twice as thick, as the simultaneously grown oxide on the substrate under the control gate. This may result in a gap thickness that is not optimized for the performance of the NVM cell. Therefore, what is needed is a NVM cell with improved performance.

Figure 1:
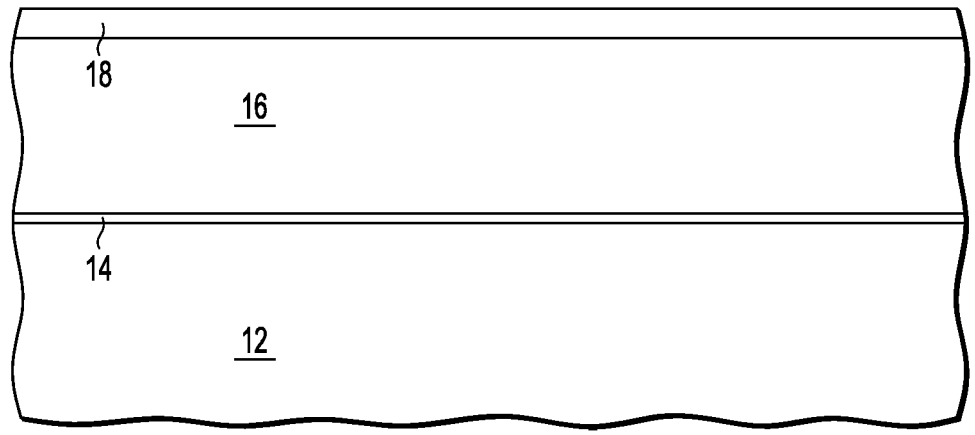
FIGS. 1-10 illustrate, in a cross-sectional view, a portion of a semiconductor device 10 in accordance with one embodiment.

FIG. 1 illustrates, in a cross-sectional view, a portion of a device 10 that is a partially completed NVM device. Semiconductor device 10 as shown In FIG. 1 comprises a substrate 12, gate dielectric 14 overlying substrate 12, a polysilicon layer 16 overlying the gate dielectric 14, and an insulating layer 18 overlying the polysilicon layer 16. Gate dielectric 14 may be grown oxide or a high k dielectric or some other material suitable for a gate dielectric. Gate dielectric may be a conventional, thermally formed silicon dioxide or silicon oxynitride with a thickness of less than 10 nanometers. In another embodiment, gate dielectric 14 may comprise an alternative gate material such as a first or second transition metal oxide or rare earth oxide material. Such alternative gate dielectric materials are suitable for their high dielectric constant (K), which enables the use of a thicker gate dielectric layer without adversely affecting the electrical and capacitive characteristics of the film. One preferred high K gate dielectric is hafnium oxide ($HfO_2$). For these alternative gate dielectrics, suitable transition metal oxide composites selected from oxides of zirconium, hafnium, aluminum, lanthanum, strontium, tantalum, titanium, silicon and the combinations thereof may be used. Transition metal silicates and aluminates may also be used for the gate dielectric, such as hafnium silicate ($Hf_xSi_yO_z$) hafnium aluminate ($Hf_xAl_yO_z$). In one embodiment, insulating layer 18 may comprise one or more of nitride and/or oxide.

Figure 2:
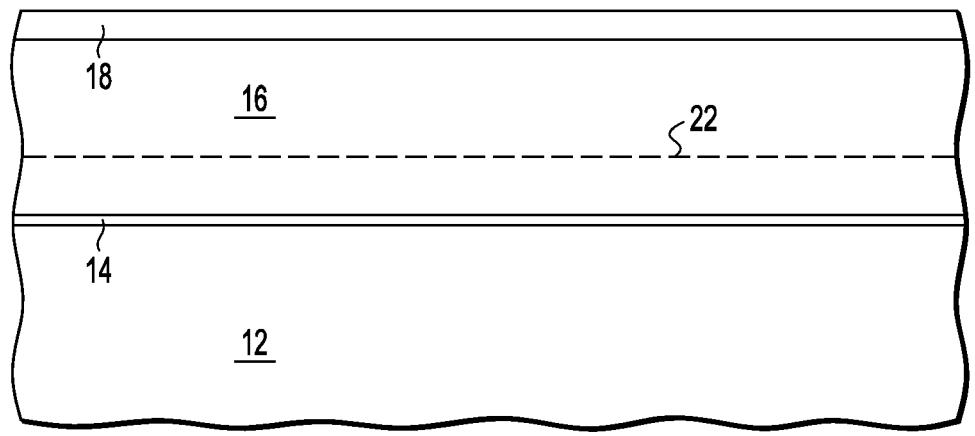

FIG. 2 illustrates, in a cross-sectional view, a semiconductor device 10 of FIG. 1 at a subsequent stage of processing in accordance with one embodiment. During the stage of processing illustrated in FIG. 2, a species or combination of species is implanted 20 into polysilicon layer 16. The species or combination of species has been chosen so that oxide growth is retarded when this species or combination of species is present in polysilicon layer 16. Depending on the implant conditions, the concentration profile of the implanted species 20 will create a region at a predetermined depth in the polysilicon layer 16 in which the implant species concentration peaks. Dotted line 22 in FIG. 2 is intended to represent this concentration peak. In one embodiment, the implant species 20 comprises nitrogen which is implanted with an implant energy of approximately 10-20 keV and a dosage of approximately 5×10e14 to 1×10e16. In alternate embodiments, other implant energies and dosages may be used, depending upon the thickness of polysilicon layer 16. As implanted, the peak nitrogen concentration depth 22 may be located at or below the middle of polysilicon layer 16. In one embodiment, the nitrogen containing implant species 20 comprises $N^+$. In one embodiment, an anneal may be performed after implant 20 in order to diffuse the nitrogen down to the interface between polysilicon 16 and gate dielectric 14. In one embodiment, the anneal may be performed using a temperature in the range of 800-900 degrees Celsius for a time duration in the range of 30-90 seconds. Alternate embodiments may not use an anneal at this step in the process.

Figure 3:
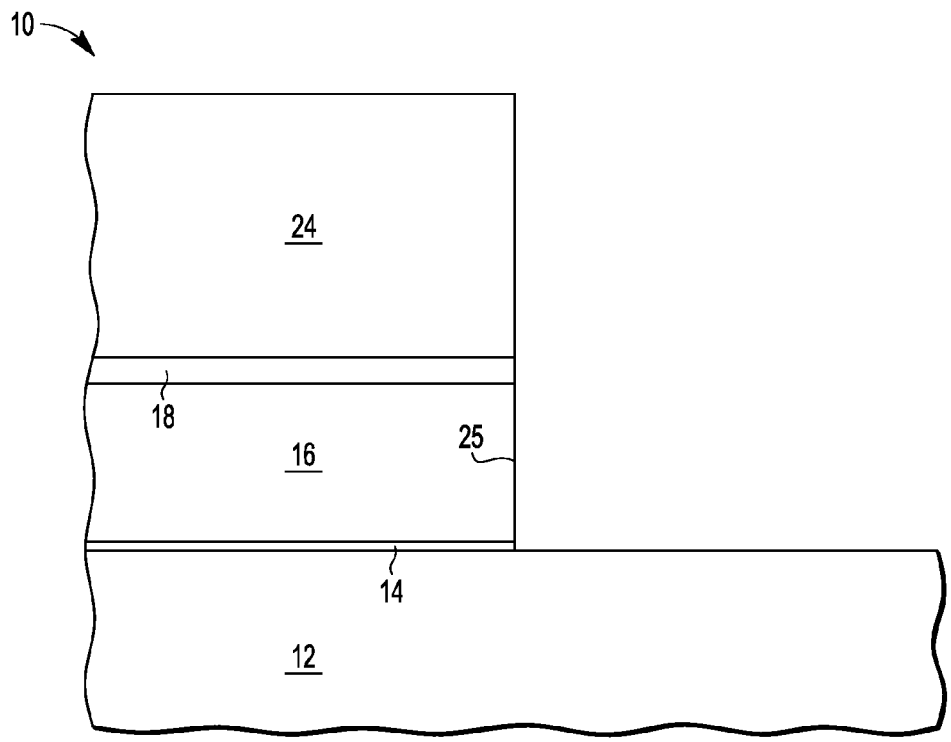

FIG. 3 illustrates, in a cross-sectional view, a semiconductor device 10 of FIG. 2 at a subsequent stage of processing in accordance with one embodiment. During the stage of processing illustrated in FIG. 3, photoresist is deposited and a portion of polysilicon layer 16 is etched to form one sidewall edge 25 of the NVM select gate. In addition a portion of gate dielectric 14 is removed, leaving a portion of substrate 12 exposed.

Figure 4:
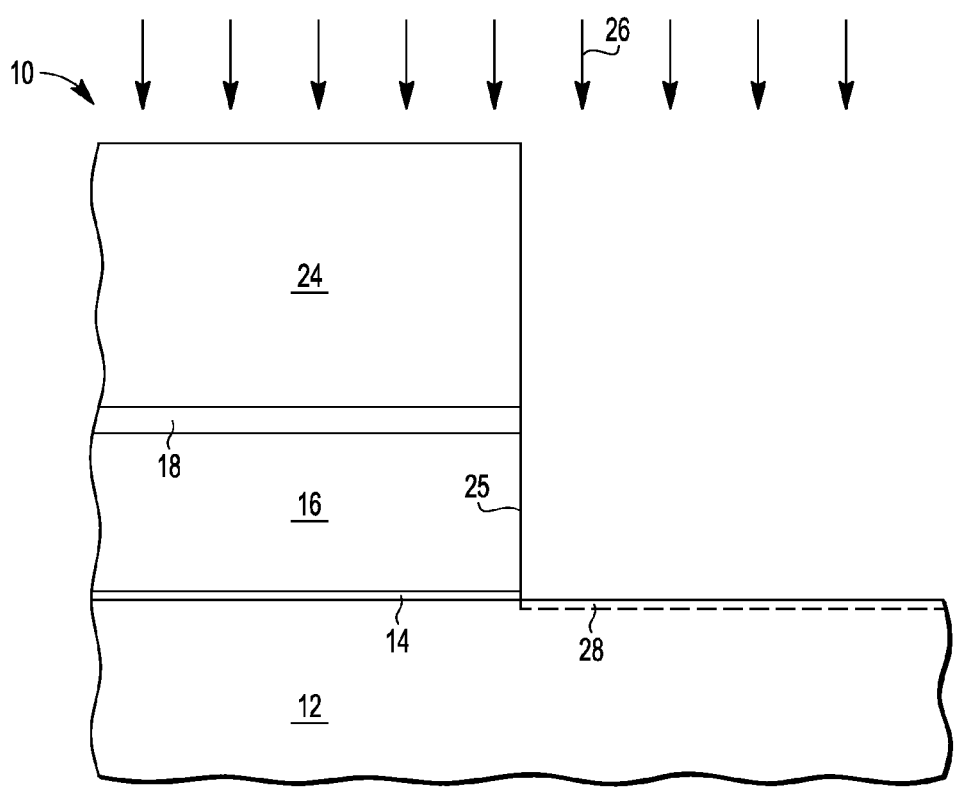

FIG. 4 illustrates, in a cross-sectional view, a semiconductor device 10 of FIG. 3 at a subsequent stage of processing in accordance with one embodiment. During the stage of processing illustrated in FIG. 4, a species or combination of species is implanted 26 into the portion of substrate 12 that was exposed in FIG. 3. The species or combination of species has been chosen so that oxide growth is accelerated when this species or combination of species is present in substrate 12. Depending on the implant conditions, the concentration profile of the implanted species 26 will create a region at a predetermined depth in the substrate 12 in which the implant species concentration peaks. Dotted line 28 in FIG. 4 is intended to represent this concentration peak. In one embodiment, the implant species 26 comprises one or more of oxygen, chlorine, and/or bromine, which is implanted with an implant energy of approximately 1-15 keV and a dosage of approximately 2×10e13 to 2×10e15. In alternate embodiments, other appropriate implant energies and dosages may be used. In one embodiment, implant 26 is relatively shallow, particularly in comparison with implant 20 (see FIG. 2).

Note that for some embodiments, photoresist 24 may be removed before implant 26 as the insulating layer 18 may be thick enough to act as a block to implant 26. In addition, an anneal may be performed after photoresist 24 has been removed in order to diffuse the nitrogen down to the interface between polysilicon 16 and gate dielectric 14, as well as to sidewall edge 25. Note that if an anneal is performed at this step in the processing, an anneal would likely not be performed directly after implant 20 (see FIG. 2). In one embodiment, the anneal may be performed using a temperature in the range of 800-900 degrees Celsius for a time duration in the range of 30-90 seconds. Alternate embodiments may not use an anneal at this step in the process.

Figure 5:
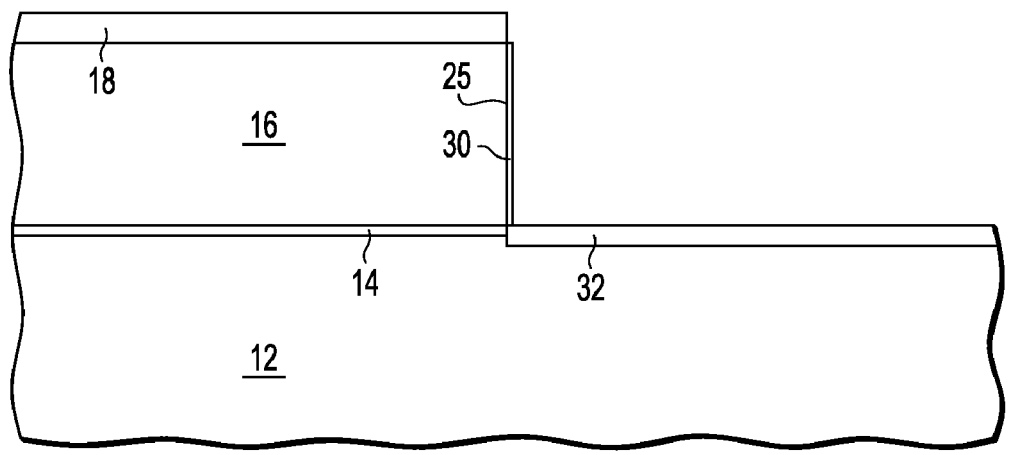

FIG. 5 illustrates, in a cross-sectional view, a semiconductor device 10 of FIG. 4 at a subsequent stage of processing in accordance with one embodiment. During the stage of processing illustrated in FIG. 5, oxide is grown on the sidewall 25 at a different rate than the oxide that is simultaneously grown on substrate 12. In one embodiment, oxide 30 is grown on the sidewall 25 of the select gate and oxide 32 is concurrently grown overlying the exposed portion of substrate 12. This differentially grown oxide may produce an oxide 30 which has a different thickness than oxide 32. Note that the thickness of oxide 30 may be twice the thickness of oxide 32 if neither implant 20 nor implant 26 was used. However, by using one or more of implants 20 and 26, the relative thicknesses of oxide 30 and 32 may be varied and controlled. In one embodiment, the thickness of oxide 30 may be thinner than the thickness of oxide 32. In one embodiment, the thickness of oxide 30 may be less than 1.5 times the thickness of oxide 32. In an alternate embodiment, the thickness of oxide 30 may be less than the thickness of oxide 32. And in yet another embodiment, the thickness of oxide 30 may be less than 0.75 the thickness of oxide 32. Note that in one embodiment, insulating layer 18 comprises nitride; and in this embodiment, an oxide does not form overlying insulating layer 18.

Figure 6:
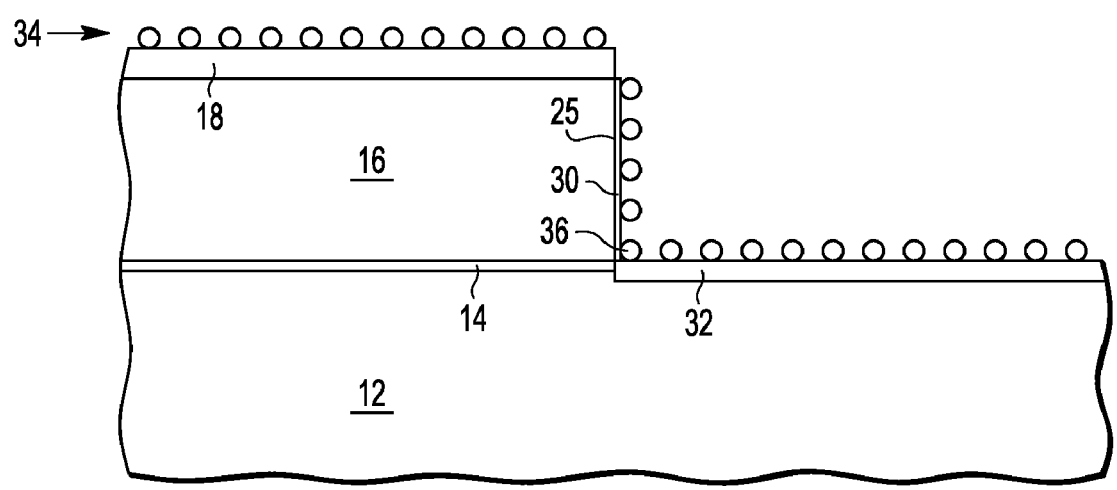

FIG. 6 illustrates, in a cross-sectional view, a semiconductor device 10 of FIG. 5 at a subsequent stage of processing in accordance with one embodiment. During the stage of processing illustrated in FIG. 6, a storage layer comprising a plurality of nanocrystals 34 has been deposited overlying the insulating layer 18, overlying the exposed portion of substrate 12, and overlying the oxide layer 30 along the sidewall 25. The illustrated embodiment of the storage layer comprises a layer of nanocrystals 34, but another type of storage layer useful in storing charge may be used instead. Nanocrystals are typically formed of silicon, but the discrete storage elements may also be formed of clusters of material consisting of, for example, of germanium, silicon carbide, any number of metals, or in any combination. Alternately, the charge storage material may consist of nitride, although any number of dielectrics containing traps may be used, such as aluminum oxide, zirconium oxide, hafnium oxide, tantalum oxide, lanthanum oxide, hafnium silicate, or hafnium aluminate. In another embodiment, the storage layer may be formed from a different material, such as for example, a floating gate formed from polysilicon.

Note that it may be easier to remove charge from certain nanocrystals (e.g. nanocrystal 36) located in the gap region adjacent to oxide 30 and oxide 32 if oxide 30 is sufficiently thin. Due to a sufficiently thin oxide 30, charge may be erased to the select gate (e.g. polysilicon layer 16) for the completed device 10 once it is fully formed. Charge on certain nanocrystals (e.g. nanocrystal 36) located in the gap region adjacent to oxide 30 and oxide 32 may be undesirable due to the potential difficulty with erasure and due to degraded NVM read current. Note that the difficulty with erasure may be due to the larger distance of certain nanocrystals (e.g. 36) from the control gate (to be subsequently formed, see FIG. 8).

Figure 7:
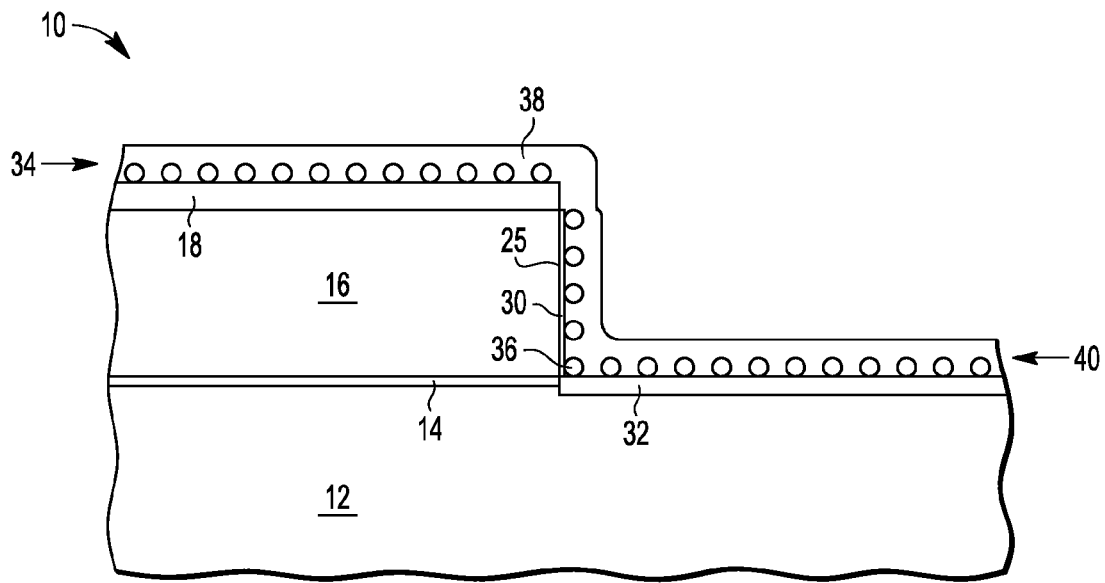

FIG. 7 illustrates, in a cross-sectional view, a semiconductor device 10 of FIG. 6 at a subsequent stage of processing in accordance with one embodiment. During the stage of processing illustrated in FIG. 7, an insulating layer 38 is formed around nanocrystals 34 and oxide 30 and oxide 32. In one embodiment, insulating layer 38 may comprise one or more dielectric materials, such as, for example, an oxide, a nitride and/or any high k dielectric. Note that a first portion of charge storage layer 40 to be used as part of the control gate stack comprises oxide 32, a portion of nanocrystals 34, and a portion of insulating layer 38; and a second portion of charge storage layer 40 along the sidewall 25 comprises oxide 30, a portion of nanocrystals 34, and a portion of insulating layer 38.

Figure 8:
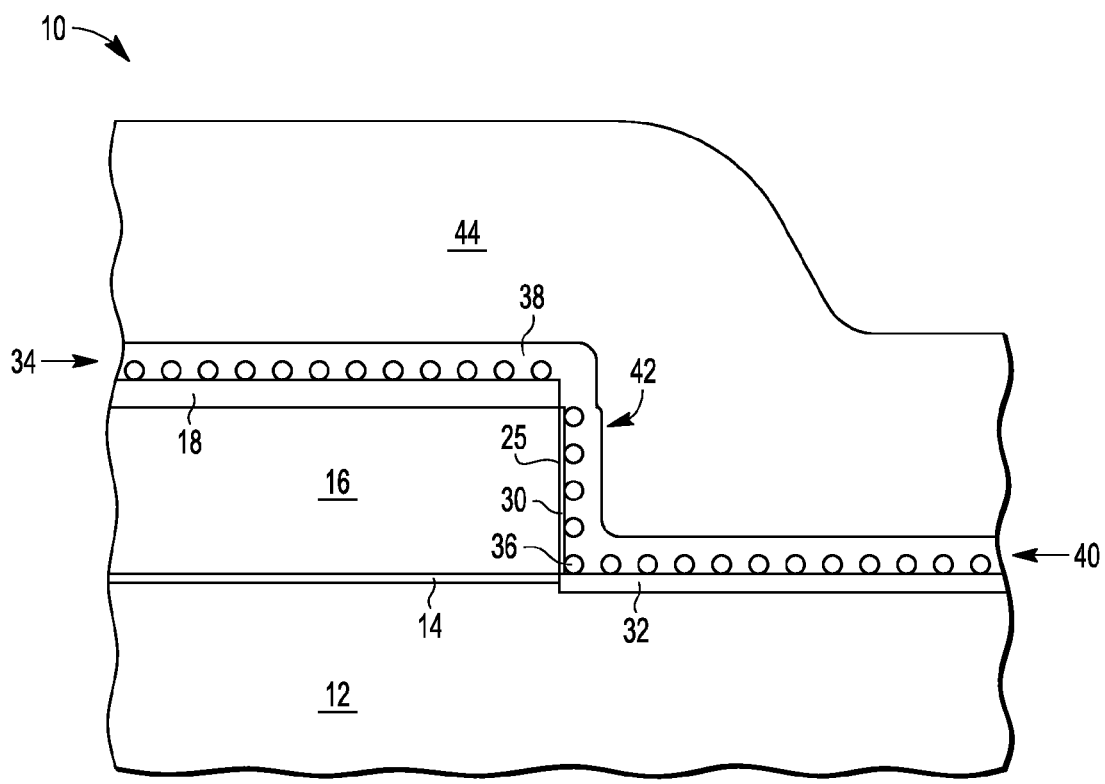

FIG. 8 illustrates, in a cross-sectional view, a semiconductor device 10 of FIG. 7 at a subsequent stage of processing in accordance with one embodiment. During the stage of processing illustrated in FIG. 8, polysilicon layer 44 may be deposited overlying charge storage layer 40 in a conventional fashion.

Figure 9:
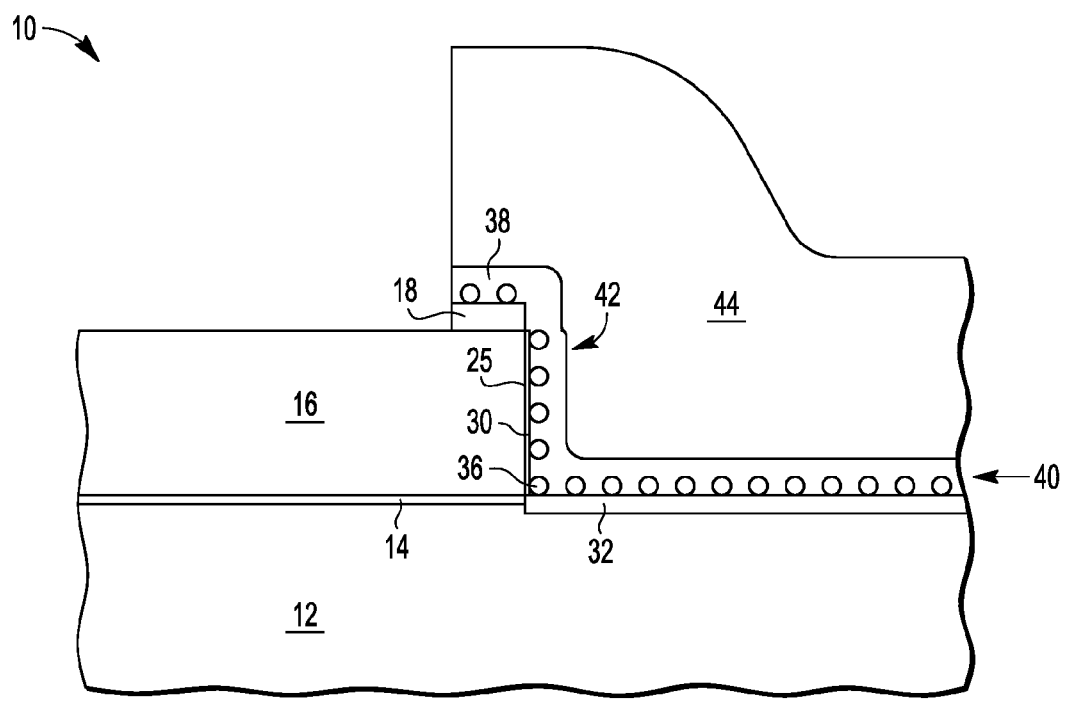

FIG. 9 illustrates, in a cross-sectional view, a semiconductor device 10 of FIG. 8 at a subsequent stage of processing in accordance with one embodiment. During the stage of processing illustrated in FIG. 9, a portion of polysilicon layer 44, a portion of charge storage layer 40, and a portion of insulating layer 18 overlying the select gate is etched in a conventional fashion. The etch is patterned so that a small portion of polysilicon layer 44 remains over polysilicon layer 16 near or adjacent to sidewall 25 of polysilicon layer 16. Charge storage layer 40 and insulating layer 18 are between polysilicon layer 16 and polysilicon layer 44 in a small area adjacent to sidewall 25.

Figure 10:
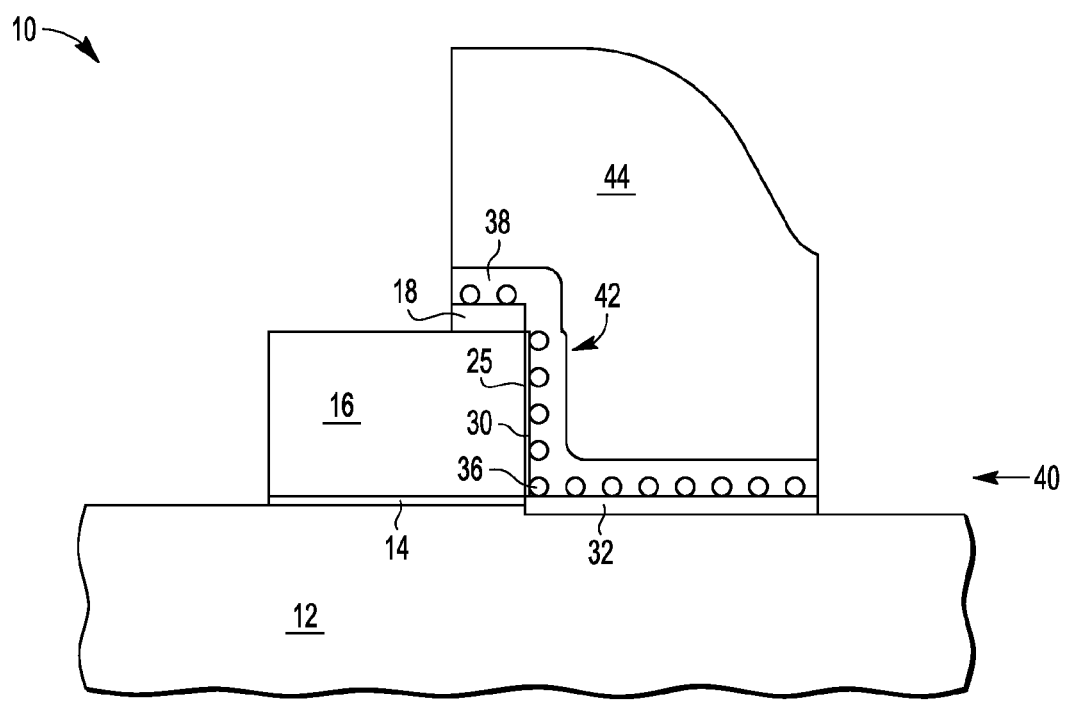

FIG. 10 illustrates, in a cross-sectional view, a semiconductor device 10 of FIG. 9 at a subsequent stage of processing in accordance with one embodiment. During the stage of processing illustrated in FIG. 10, polysilicon layer 16 and gate dielectric layer 14 are etched to leave the select gate portion of polysilicon layer 16. As shown in FIG. 10, the select gate portion of polysilicon 16 has had a portion removed on the side away from polysilicon layer 44. Similarly, polysilicon layer 44 has had a portion removed on the side way from the select gate portion of polysilicon 16. This results in exposing portions of substrate 12 on each side of the remaining portions of polysilicon layer 16 and polysilicon layer 44.

Figure 11:
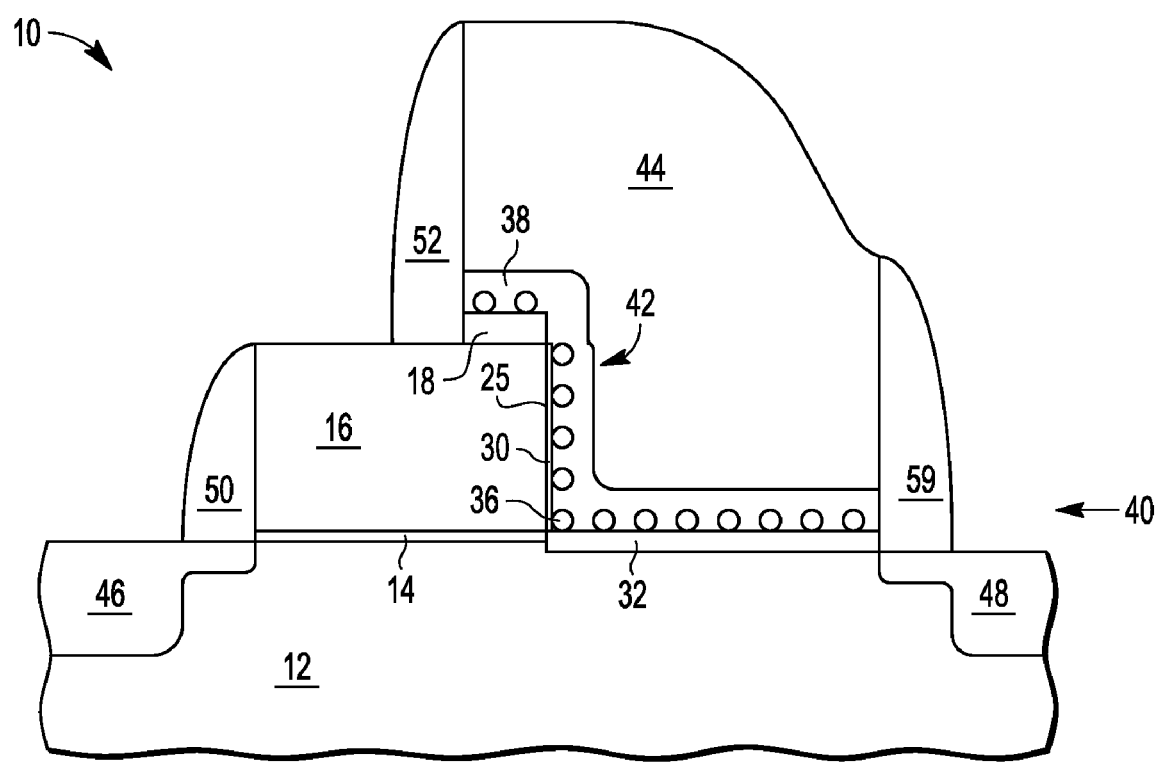
FIG. 11 illustrates, in a cross-sectional view, a semiconductor device 10 in accordance with one embodiment.

FIG. 11 illustrates, in a cross-sectional view, a semiconductor device 10 of FIG. 10 at a subsequent stage of processing in accordance with one embodiment. During the stage of processing illustrated in FIG. 11, the formation of device 10 is completed in a conventional fashion. Completed device 10 comprises source/drain regions 46 and 48 and sidewall spacers 50, 52, and 54 formed as illustrated.

Note that alternate embodiments may use only implant 20 (see FIG. 2), only implant 26 (see FIG. 4), or both implant 20 and implant 26. In yet other embodiments, additional implants may be used to impact the thicknesses of concurrently grown oxide 30 and oxide 32.

By now it should be appreciated that there has been provided a nonvolatile split gate memory cell being formed using concurrent, differential oxide growth for optimizing the performance of the cell. In one embodiment, an implant (e.g. 20 in FIG. 2) may be used to retard oxide growth (e.g. the thickness of oxide 30 in FIG. 5) in a polysilicon layer 16. In an alternate embodiment, an implant (e.g. 26 in FIG. 4) may be used to accelerate oxide growth (e.g. the thickness of oxide 32 in FIG. 5) in a silicon substrate 12. In yet another embodiment, both implant 20 and implant 26 may be used in a same device 10.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different processes may be used for obtaining some of the temporary structures obtained in order to produce oxides 30 and 32 having the desired thicknesses. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A method of making a split gate nonvolatile memory cell on a semiconductor layer, comprising:
    forming a gate dielectric for example (14) over the semiconductor layer for example (12);
    depositing a first layer of gate material for example (16) over the gate dielectric;
    etching the first layer of gate material to remove a portion of the first layer of gate material over a first portion of the semiconductor layer and to leave a select gate portion having a sidewall for example (25) adjacent to the first portion;
    applying a treatment for example (20, 26) over the semiconductor layer to reduce a relative oxide growth rate of the sidewall to the first portion;
    growing oxide on the sidewall to form a first oxide for example (30) on the sidewall and on the first portion to form a second oxide for example (32) on the first portion after the applying the treatment;
    forming a charge storage layer for example (34) over the first oxide and along the second oxide; and
    forming a control gate for example (44) over the second oxide and adjacent to the sidewall.

2. The method of statement 1, or any other appropriate statement herein, wherein the applying treatment is performed prior to the step of etching.

3. The method of statement 1, or any other appropriate statement herein, wherein the step of applying the treatment comprises implanting nitrogen for example (20) into the first layer of gate material.

4. The method of statement 3, or any other appropriate statement herein, wherein the implanting is performed at an energy sufficient for the nitrogen to implanted at a depth for example (22) of more than halfway through the first layer of gate material.

5. The method of statement 4, or any other appropriate statement herein, wherein the implanting further comprises implanting oxygen for example (26) into the first portion after the step of etching.

6. The method of statement 5, or any other appropriate statement herein, wherein the step of implanting nitrogen is performed prior to the step of etching.

7. The method of statement 6, or any other appropriate statement herein, further comprising forming source/drain regions for example (46, 48) after the step of forming the control gate.

8. The method of statement 1, or any other appropriate statement herein, wherein the step of treating comprises implanting oxygen for example (26) into the first portion after the step of etching.

9. The method of statement 8, or any other appropriate statement herein, wherein the step of implanting oxygen for example (26) is at an energy so that the oxygen is implanted to a depth of less than 10 nanometers.

10. The method of statement 9, or any other appropriate statement herein, wherein the step of treating further comprises implanting nitrogen for example (20) into the first layer of gate material prior to the step of etching.

11. The method of statement 10, or any other appropriate statement herein, wherein the step of implanting nitrogen is further characterized by the nitrogen being in the form of $N^+$.

12. The method of statement 11, or any other appropriate statement herein, wherein the step of forming the charge storage layer comprises forming nanocrystals.

13. The method of statement 1, or any other appropriate statement herein, wherein the step of etching is further characterized as etching the gate dielectric over the first portion.

14. A method of making a split gate nonvolatile memory cell on a semiconductor layer, comprising:
    forming a gate dielectric for example (14) over the semiconductor layer for example (12);
    depositing a first layer of gate material for example (16) over the gate dielectric for example (14);
    exposing a sidewall for example (25) of the first layer of gate material and a first portion of the semiconductor layer for example (12), wherein the first portion is adjacent to the sidewall;

growing oxide on the sidewall to form a first oxide layer for example (30) on the sidewall and oxide on the first portion to form a second oxide layer for example (32) on the first portion, wherein the first oxide layer has a first thickness and the second oxide layer has a second thickness less than the first thickness; and forming a control gate for example (44) over the second oxide layer.

15. The method of statement 14, or any other appropriate statement herein, further comprising causing a presence of nitrogen on the sidewall for example (25) prior to the step of growing oxide.

16. The method of statement 14, or any other appropriate statement herein, further comprising implanting oxygen for example (26) into the first portion of the semiconductor layer for example (12) prior to the step of growing.

17. The method of statement 16, or any other appropriate statement herein, further comprising implanting nitrogen for example (20) into the first layer of gate material for example (16) at an energy that causes the nitrogen to reach more than halfway for example (22) into first layer of gate material.

18. The method statement 17, or any other appropriate statement herein, wherein the step of forming the control gate for example (44) is further characterized as forming polysilicon.

19. A split gate nonvolatile memory cell, comprising:
a select gate for example (16) over a semiconductor layer for example (12);
a control gate for example (44) over the semiconductor layer for example (12);
a charge storage layer for example (34) having a first portion between the control gate for example (44) and the semiconductor layer for example (12) and a second portion between select gate for example (16) and the control gate, wherein the charge storage layer for example (34) comprises a plurality of nanocrystals; and
a gate dielectric for example (14) between the select gate for example (16) and the semiconductor layer for example (12);
a first oxide layer for example (30) on the select gate for example (16) and in contact with a first subset of the plurality of nanocrystals; and
a second oxide layer for example (32) on the semiconductor layer and in contact with a second subset of the plurality of nanocrystals, wherein the first oxide layer for example (30) has a thickness less than a thickness of the second oxide layer for example (32).

20. The split gate nonvolatile memory cell for example (10) of statement 19, or any other appropriate statement herein, wherein nitrogen is present at an interface between the first oxide layer for example (30) and the select gate for example (16).

What is claimed is:

1. A method of making a split gate nonvolatile memory cell on a semiconductor layer, comprising:
forming a gate dielectric over the semiconductor layer;
depositing a first layer of polysilicon gate material over the gate dielectric;
etching the first layer of polysilicon gate material to remove a portion of the first layer of polysilicon gate material over a first portion of the semiconductor layer and to leave a select gate portion having a sidewall adjacent to the first portion;
applying a treatment over the semiconductor layer to reduce a relative oxide growth rate of the sidewall to the first portion, wherein the applying the treatment is performed prior to the step of etching;
growing oxide on the sidewall to form a first oxide on the sidewall and on the first portion to form a second oxide on the first portion after the applying the treatment;
forming a charge storage layer over the first oxide and along the second oxide; and
forming a control gate over the second oxide and adjacent to the sidewall.

2. The method of claim 1, wherein the step of applying the treatment comprises implanting nitrogen into the first layer of polysilicon gate material.

3. The method of claim 2, wherein the implanting is performed at an energy sufficient for the nitrogen to implanted at a depth of more than halfway through the first layer of polysilicon gate material.

4. The method of claim 3, wherein the implanting further comprises implanting oxygen into the first portion after the step of etching.

5. The method of claim 4, wherein the step of implanting nitrogen is performed prior to the step of etching.

6. The method of claim 5, further comprising forming source/drain regions after the step of forming the control gate.

7. The method of claim 1, wherein the step of treating comprises implanting oxygen into the first portion after the step of etching.

8. The method of claim 7, wherein the step of implanting oxygen is at an energy so that the oxygen is implanted to a depth of less than 10 nanometers.

9. The method of claim 8, wherein the step of treating further comprises implanting nitrogen into the first layer of polysilicon gate material prior to the step of etching.

10. The method of claim 9, wherein the step of implanting nitrogen is further characterized by the nitrogen being in the form of $N^+$.

11. The method of claim 10, wherein the step of forming the charge storage layer comprises forming nanocrystals.

12. The method of claim 1, wherein the step of etching is further characterized as etching the gate dielectric over the first portion.

13. A method of making a split gate nonvolatile memory cell on a semiconductor layer, comprising:
forming a gate dielectric over the semiconductor layer;
depositing a first layer of polysilicon gate material over the gate dielectric;
applying a treatment over the semiconductor layer to reduce a relative an oxide growth rate in the polysilicon gate material;
exposing a sidewall of the first layer of polysilicon gate material and a first portion of the semiconductor layer, wherein the first portion is adjacent to the sidewall, and the applying the treatment is performed prior to the exposing the sidewall;
growing oxide on the sidewall to form a first oxide layer on the sidewall and oxide on the first portion to form a second oxide layer on the first portion, wherein the first oxide layer has a first thickness and the second oxide layer has a second thickness less than the first thickness; and
forming a control gate over the second oxide layer.

14. The method of claim 13, further comprising causing a presence of nitrogen on the sidewall prior to the step of growing oxide.

15. The method of claim 13, further comprising implanting oxygen into the first portion of the semiconductor layer prior to the step of growing.

16. The method of claim 15, further comprising implanting nitrogen into the first layer of polysilicon gate material at an energy that causes the nitrogen to reach more than halfway into first layer of polysilicon gate material.

17. The method claim 16, wherein the step of forming the control gate is further characterized as forming polysilicon.

* * * * *